(12) United States Patent
Kawahara et al.

(10) Patent No.: US 6,344,693 B1
(45) Date of Patent: Feb. 5, 2002

(54) SEMICONDUCTOR DEVICE AND METHOD FOR MANUFACTURING SAME

(75) Inventors: Jun Kawahara; Yoshihiro Hayashi, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/572,632

(22) Filed: May 17, 2000

(30) Foreign Application Priority Data

May 18, 1999 (JP) .............................. 11-137619

(51) Int. Cl.[7] .................. H01L 23/48; H01L 23/52; H01L 29/40
(52) U.S. Cl. .................. 257/759; 257/758; 257/750
(58) Field of Search ................ 257/759, 758, 257/750

(56) References Cited

U.S. PATENT DOCUMENTS 5,929,790 A * 7/1999 Wetzel et al.
6,146,985 A * 11/2000 Wollesen
6,245,665 B1 * 6/2001 Yokoyama
6,284,149 B1 * 9/2001 Li et al.

FOREIGN PATENT DOCUMENTS

| JP | 2611615 | 2/1997 |
| JP | 10-41385 | 2/1998 |
| JP | 10-150105 | 6/1998 |

* cited by examiner

*Primary Examiner*—Sheila V. Clark

(57) ABSTRACT

In a method for manufacturing a semiconductor device having a first insulation film, a second insulation film formed over the first insulation film, an inlayed interconnection layer formed in the second insulation film, and an organic film provided on the inlayed interconnection layer and the second insulation film, the organic film having a dielectric constant lower than the second insulation film, the organic film is grown inside a vacuum chamber.

2 Claims, 14 Drawing Sheets

(a)          (b)

(a)

(b)

(c)

(d)

(a)　　　　　　　　(b)

(c)

(a)

(b)

(c)

(d)

(a)

(b)

(c)

(a)

(b)

(c)

(d)

(a)

(b)

(c)

(d)

(a)

(b)

(c)

(d)

(a)

(b)

(c)

(d)

(a)  (b)

(c)  (d)

SEMICONDUCTOR DEVICE AND METHOD FOR MANUFACTURING SAME

BACKGROUND OF THE INVENTION

1. Field of the Invention

The present invention relates to a semiconductor device and to a method for manufacturing a semiconductor device, and more particularly it relates to a method for manufacturing multilayer interconnections.

2. Background of the Invention

The design rule in semiconductor integrated circuits continues to shrink, and with this comes a prominent deterioration of performance caused by delays in interconnections. That is, while the signal delay in interconnections in a semiconductor integrated circuit is determined by the RC constant (R: resistance, C: capacitance) of the interconnection, the increase in the interconnection resistance with a reduction in width of the interconnection, and the increase in capacitance between interconnections caused by a reduced spacing between interconnections create the problem that the above-mentioned RC constant will prevent speed up switching speed of the transistor. At present, an alumina alloy is used as the interconnection material in semiconductor integrated circuits, although copper or silver interconnections are being studied because of their low resistance.

With copper interconnections, because processing is more difficult than with alumina interconnections, a trench is formed in the interlayer insulation film, the interconnection metal being buried therein, the excess metal over the interlayer insulation film being removed using CMP(chemical mechanical polishing). This process is known as a damascene interconnection structure. In this damascene interconnection structure, as shown in FIG. 16, if copper is used in the first interconnection layer 6 and second interconnection layer 15, because copper has a great tendency to oxidize, a first interconnection protective layer 7 and second interconnection protective layer 16 are formed immediately above the copper damascene interconnections, these being made of silicon nitride or silicon oxinitride films. In addition to use these layers as layers that protect the copper interconnections from oxidation, this silicon nitride or silicon oxinitride film are used as the first etching stop film 3 and the second etching stop film 9 as shown in FIG. 17, when forming the trench for interconnections.

In order to reduce the capacitance between interconnections, it is effective to use an insulation material that has a lower dielectric constant than the currently used silica ($SiO_2$). However, the silicon nitride or silicon oxinitride film used in the damascene interconnection structure has a high dielectric constant of approximately 7, so that even if an insulating material having a low dielectric constant is used to reduce the capacitance between interconnections, that effect is canceled out by the film having a high dielectric constant, so that the overall effect is lessened. Because the interconnection protective film is provided directly above the copper interconnection, and the interconnection trench etching stop film is provided immediately below the interconnection, the interconnection is sandwiched between two high dielectric constant films. For example, in a second example of the past by Igarashi et al ("The Best Combination of Aluminum and Copper Interconnects for High Performance 0.18 $\mu$m CMOS Logic Device", 1998 International Electron Device Meeting Technical Digest, p. 829), a protective film is disposed immediately above the interconnection, and an etching stop film is disposed immediately below the interconnection (FIG. 17). In this second past example, after forming a first protective layer 7 on a first interconnection layer 6, a third insulation film 8 and second etching stop film 9 are formed. Using the second resist (contact hole pattern) as a mask, a second aperture 11 for a contact hole is formed in the second etching stop film 9. The second resist is removed, and a fourth insulation film 12 is formed, after which a third resist (interconnection trench pattern) is formed. When this is done, an interconnection trench resist pattern that is larger than the contact hole diameter is formed at the top part of the contact hole aperture 11 formed on the second etching stop film 9. When this resist pattern is used as a mask to perform etching, in the fourth insulation film 12 an interconnection trench that has the third aperture is formed, which has as its bottom the second etching stop film 9, in a region of the second etching stop film 9 in which there is no contact hole aperture.

In a region of the second etching stop film 9 in which a contact hole aperture 11 is formed, the progressive etching forms a contact hole, which has as its bottom the first protective film 7. In this condition, the third resist used in etching is removed. Additionally, in order to make contact with the lower-layer first interconnection layer 6, the first interconnection protective film 7 is etched, thereby completing the contact hole. After that, a copper film is formed over the entire surface, and the CMP method is used to remove the copper over the fourth insulation film 12, thereby enabling the formation of a inlayed interconnection that is integral with the contact plug.

In the above-noted example of the past, however, there are the following problems.

The first problem is the increase in the capacitance between interconnections. By disposing a silicon nitride film, which has a high dielectric constant, either above, below, or both above and below the interconnection, pairs of interconnections are disposed with a insulation film having a high dielectric constant therebetween, this causes an increase in the capacitance between interconnections, and particularly between horizontal-direction interconnections. If silicon nitride or silicon oxinitride is used in an etching stop film or an interconnection protective film, the high dielectric constant of this substance itself causes an increase in the capacitance between interconnections. In order that there is not an increase in the effective capacitance between interconnections, it is necessary to reduce as much as possible the proportion of a film having a high dielectric constant, or to eliminate it entirely.

The second problem is that, in the case in which the first interconnection is made of copper or the like which does not form an inactive oxide, if plasma CVD is used to form a film containing oxygen, such as an oxide or nitride film as a first interconnection protective film, oxygen ions or oxygen radicals in the plasma gas cause oxidation of the surface of the first interconnection, thereby causing a great increase in the resistance of the interconnection.

The Japanese Unexamined Patent Publication (KOKAI) No. 10-150105 discloses the making of an interlayer insulation film with a inlayed interconnection having a low dielectric constant.

In the above-noted technology, however, because of the low performance as an etching stop film, there is the problem of not being able to achieve the prescribed etching.

Additionally, although there is indication of film growth by the application of a low dielectric constant organic insulation film immediately above the inlayed interconnection, in the general method used for such application, in order to remove water from the surface, a hot plate or the like is used to heat to a temperature of 120° C. immediately before application, and when copper is used as the interconnection material, the heating will be done with the copper in the exposed condition, so that the copper surface is easily oxidized.

Accordingly, it is an object of the present invention to improve on the above-noted problems with the prior art, by providing a semiconductor device and method for manufacturing a semiconductor device, which in particular makes use of a low dielectric constant film as a protective film immediately above an inlayed copper interconnection, and a low dielectric constant insulation film is used as an etching stop film immediately below the inlayed interconnection. In the present invention, by forming an organic insulation film immediately above the inlayed interconnection in a vacuum chamber an increase in interconnection resistance caused by oxidation is suppressed, and also the interconnection capacitance is reduced, thereby reducing the interconnection delay in the semiconductor device, and improving operational stability by improving either the operating speed or operation margin.

SUMMARY OF THE INVENTION

In order to achieve the above-noted object, the present invention has the following technical constitution.

Specifically, a first aspect of a semiconductor device according to the present invention is a semiconductor device having a first insulation film, a second insulation film formed over the first insulation film, an inlayed interconnection layer formed in the second insulation film, an organic film provided on the inlayed interconnection layer and the second insulation film, this organic film having a dielectric constant that is lower than the second insulation film, and an etching stop film provided over the organic film.

In a second aspect of the present invention, the second insulation film is an organic film having a dielectric constant that is lower than the first insulation film.

A first aspect of a method for manufacturing a semiconductor device according to the present invention is a method for manufacturing a semiconductor device having a first insulation film, a second insulation film formed over the first insulation film, an inlayed interconnection layer formed in the second insulation film, and an organic film provided on the inlayed interconnection layer and the second insulation film, and the organic film having a dielectric constant that is lower than the second insulation film, wherein, the organic film is grown in a vacuum chamber.

In a second aspect of a method for manufacturing a semiconductor device according to the present invention, an etching stop film is formed over the organic film.

An embodiment of a multilayer interconnection according to the present invention is shown in FIG. 1. An organic film grown in a vacuum chamber is used as an interconnection protective film over the copper interconnection layer. If the interconnection is made of copper, because the copper can easily become oxidized, a process which has an atmosphere in which the copper does not oxidize, is required after the formation of the interconnection layer. Therefore, by film growth in a vacuum chamber, it is possible to form an interconnection protective film without exposing the surface of the copper to oxygen, that is, without causing oxidation of the surface of the copper interconnection.

Because the above-mentioned interconnection protective film is formed immediately above the interconnection, a dielectric constant of the interconnection protective film has a large influence on the capacitance between interconnections. However, by using a film having a dielectric constant that is lower than that of a silicon nitride or silicon oxinitride film, the capacitance between interconnections can be reduced, particularly with regard to horizontal interconnections. Additionally, the first aperture or third aperture, which is the interconnection trench, has at its bottom a first or second etching stop film, made of an organic insulation film grown in a vacuum chamber. By doing this, it is easy to control the depth of the interconnection trench. If a film having a low dielectric constant is used also in the first or second etching stop film disposed immediately below the first or second interconnection layer, it is possible to reduce the capacitance between interconnections, in comparison with the case in which, as done in the past, a silicon nitride or silicon oxinitride film was used.

For example, consider a structure such as shown in FIG. 2(a), in the three-layer interconnection of which a silicon oxide film is used as the interlayer insulation film, and silicon nitride films are used as the etching stop film immediately below the interconnection and the interconnection protective film immediately above the interconnection. The interconnection width and horizontal spacing are 0.28 $\mu$m, the interconnection height is 0.504 $\mu$m. The thickness of the silicon nitride film is 0.1 $\mu$m. Of the interconnections shown in FIG. 1(a), with the center interconnection as a signal line, and the other interconnections grounded, the wiring capacitance per unit length, calculated with a dielectric constant of the silicon oxide film of 4 and a dielectric constant of the silicon nitride film of 7.3, is $2.79 \times 10^{-16}$ F/$\mu$m. FIG. 1(b) shows structure in which, in the structure shown in FIG. 1(a), the silicon nitride film is replaced by an organic film grown in a vacuum chamber, this being a benzocyclobutene (BCB) film, with a dielectric constant of 2.7. In this structure, the capacitance of the center interconnection per unit length is $2.13 \times 10_{-16}$ F/$\mu$m. Thus, by replacing this film immediately below and above interconnection by film having a low dielectric constant, in this case by a BCB film, there is a great reduction in the capacitance between interconnections, this being 24% in the present invention.

It is desirable to dispose the interconnection protective film immediately above the interconnection and make this film have a low dielectric constant, there is also a need to have this serve also as an etching stop film when forming a contact hole. However, if its performance as an etching stop film is insufficient, even if the dielectric constant is high, it is effective to have dual layered structure, in which one layer is a film with good functioning as an etching stop film and the other layer is a film with a low dielectric constant, this enabling minimization of the increase in capacitance between interconnections caused by using a high dielectric constant film.

BRIEF DESCRIPTIONS OF THE DRAWINGS

FIG. 1 is a cross-section view showing a multilayer interconnection structure according to the present invention.

FIG. 2(a) and FIG. 2(b) are cross-section views of a multilayer interconnection structure to illustrate the effect of the present invention.

FIG. 3(a) to FIG. 3(d) are cross-section views showing the manufacturing process for a first embodiment of a multilayer interconnection structure according to the present invention.

FIG. 4(a) to FIG. 4(c) are cross-section views showing manufacturing steps following FIG. 3.

FIG. 5(a) to FIG. 5(d) are cross-section views showing the manufacturing process for a second embodiment of a multilayer interconnection structure according to the present invention.

FIG. 6(a) to FIG. 6(c) are cross-section views showing manufacturing steps following FIG. 5.

FIG. 7(a) to FIG. 7(d) are cross-section views showing the manufacturing process for a third embodiment of a multilayer interconnection structure according to the present invention.

FIG. 8(a) to FIG. 8(c) are cross-section views showing manufacturing steps following FIG. 7.

FIG. 9(a) to FIG. 9(d) are cross-section views showing the manufacturing process for a fourth embodiment of a multilayer interconnection structure according to the present invention.

FIG. 10(a) to FIG. 10(d) are cross-section views showing manufacturing steps following FIG. 9.

FIG. 11(a) to FIG. 11(d) are cross-section views showing the manufacturing process for a fifth embodiment of a multilayer interconnection structure according to the present invention.

FIG. 12(a) to FIG. 12(d) are cross-section views showing manufacturing steps following FIG. 11.

DETAILED DESCRIPTION OF THE PREFERRED EMBODIMENTS

Preferred embodiments of a semiconductor device and method for manufacturing a semiconductor device according to the present invention are described in detail below, with references being made to relevant accompanying drawings.

Example 1

In the first embodiment of the present invention, an organic film grown in a vacuum chamber is used as either an interconnection protective film disposed over a copper interconnection layer or as an etching stop film. A method of growing a DVS-BCB (divinyl siloxane bisbenzocyclobutene) film as an organic film that can be grown in a vacuum chamber is described below. This method is one in which an organic monomer is vaporized, monomer in the vapor phase being polymerized on a substrate, to obtain an organic polymer film.

Figure 13:
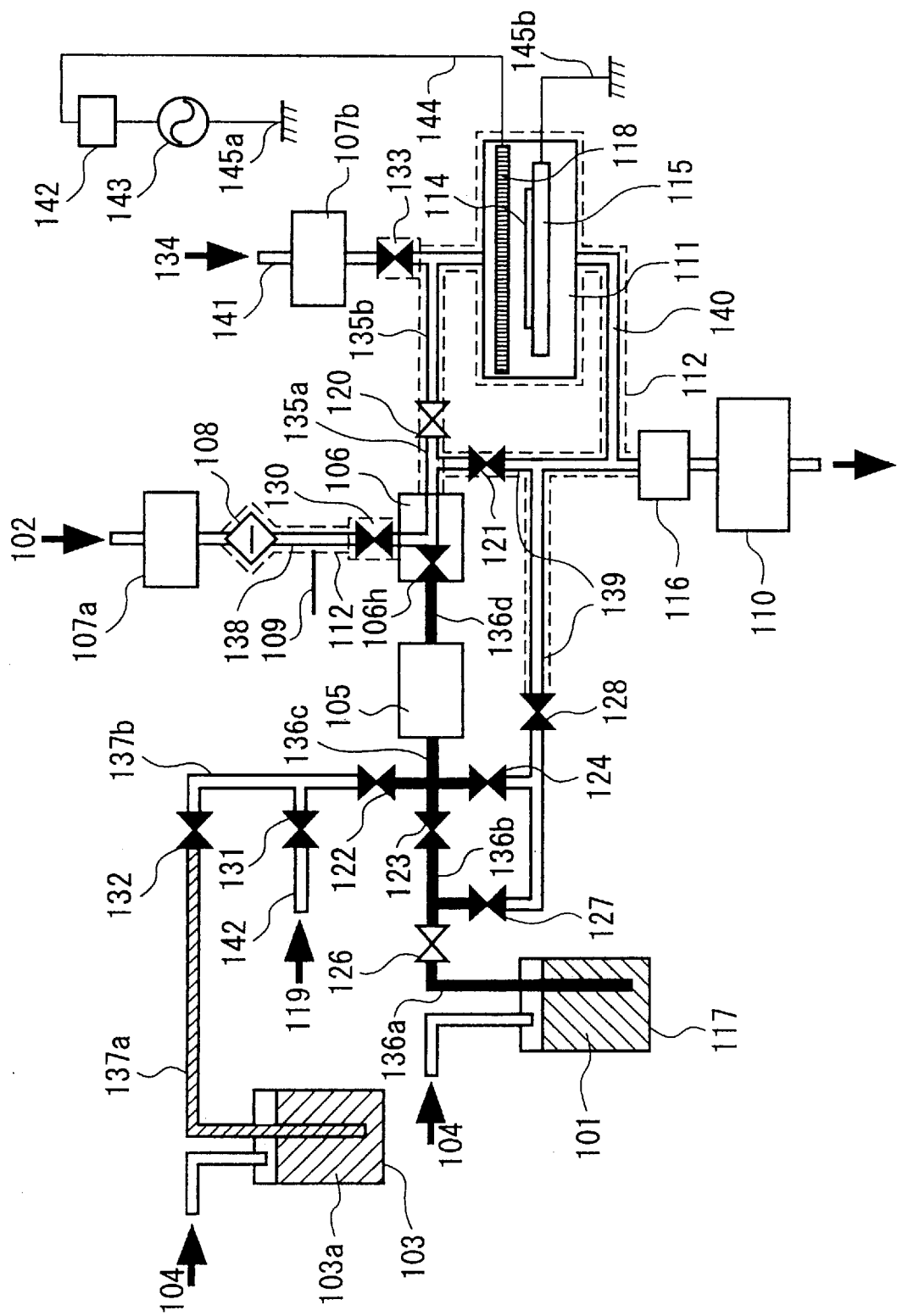
FIG. 13 is a simplified drawing showing an apparatus for forming a polymer film.

As shown in FIG. 13, a polymer film growing apparatus used in the present invention is formed by an organic monomer tank 117, a fluid flow indicator 105, a vaporization controller 106, a carrier gas heating filter 108, gas flow controllers 107a and 107b, a reaction chamber 111, a pipe heater 112, a cooling trap 116, an exhaust pump 110, and a cleaning solution tank 103, and also has piping and control valves for introducing a carrier gas 102, a cleaning gas 134, a purging gas 119, and a pressure transmission gas 104. In this case, the organic monomer tank 117 has in it a divinyl siloxane bisbenzocyclobutene monomer (DVS-BCB monomer), which satisfies the following structure.

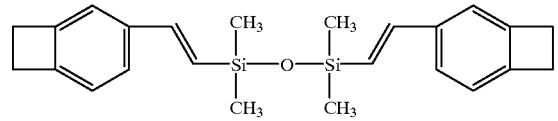

Mesitylene is stored in the cleaning solution tank 103, and helium (He) is used for the carrier gas 102, the purging gas 119, and the pressure transmission gas 104. The cleaning gas 134 is a mixture of $SF_6$ with oxygen or ozone. This can alternately be a mixture of the fluorocarbon gas $CF_4$ or $C_2F_6$ and oxygen or ozone.

Referring to FIG. 13, the series of process steps by the polymer film growing apparatus in converting a DVS-BCB monomer to a DVS-BCB polymer film is as follows. First, in the initial condition a diaphragm valve 106h in the vaporization controller 106, a valve 121, and a valve 128 are in the open condition, the exhaust pump 110 generating a vacuum in the reaction chamber 111, the exhaust pipe 140, the effluent pipe 139, the vaporization controller 106, the fluid flow indicator 105, the vaporization raw material supply pipes 135a and 135b, and the organic monomer pipes 136c and 136d. The pipe heater 112 slightly heats the carrier gas supply pipe 138, the vaporization raw material supply pipes 135a and 135b, the effluent pipe 139, and the exhaust pipe 140, to the same temperature as the set vaporization temperature of the monomer, or to a temperature at which there is no prominent polymerization reaction of the organic monomer (polymerization speed>1%/minute). For example, if the vaporization temperature of the DVS-BCB monomer is made 150° C., the pipe heater temperature is set to 170° C. The pipe temperature is monitored by means of thermocouples installed in various locations in the piping, and the pipe heater is controlled so as to maintain this set temperature at all times.

The diaphragm valve 106h within the vaporization controller 106 and the valve 121 are closed, and the valves 130 and 120 are opened, so that the carrier gas (He) 102 is supplied from the carrier gas supply pipe 138 to the vaporization controller 106, via the gas flow controller 107a and the carrier gas supply filter 108, and this carrier gas is additionally supplied via the vaporization raw material supply pipes 135a and 135b to the reaction chamber 111, and is exhausted via the exhaust pipe 140 by the exhaust pump 110.

Figure 14:
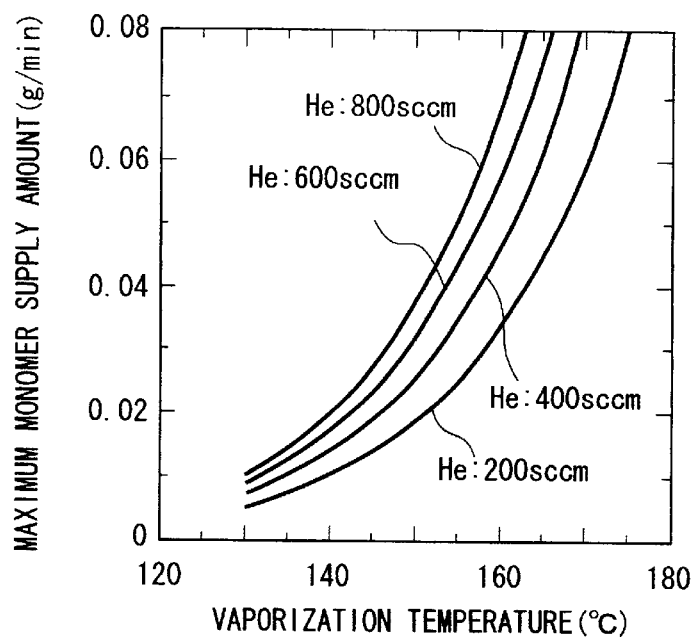
FIG. 14 is a graph showing the vaporization characteristics indicating the relationship between the DVS-BCB monomer vaporization temperature and the maximum monomer supply amount in a vaporization controller.

With the above-noted arrangement, the vaporization controller 106 is heated by 150° C., and the carrier gas heating filter 108 heats the He gas until it reaches the same temperature as the vaporization temperature. By preheating the helium gas introduced into the vaporization controller 106 to the vaporization temperature, the re-liquefaction of the DVS-BCB monomer by a temperature decrease is prevented. While the carrier gas preheating temperature is generally the same as the vaporization temperature, it is also possible to raise the temperature to temperature at which there is no prominent polymerization reaction of the organic monomer (polymerization speed>1%/minute), this being approximately 175° C. for the case of DVS-BCB. However, it is necessary to set this preheating temperature to a temperature that does not exceed the withstanding temperature of the valves used in this polymer film growing apparatus (for example, 200° C.). In this case, from the 150° C.

vaporization characteristic curve for DVS-BCB (FIG. 14), the flow of the helium gas was set to 500 sccm. Under this condition, the total pressure P of the vaporization controller 106 is 7 Torr, and the pressure of the reaction chamber is 2.0 Torr. A substrate heater 115 installed in the reaction chamber 111 heats the silicon substrate (semiconductor substrate) 114 onto which is formed an integrated circuit to a temperature from 250° C. to 400° C.

After the above is done, the valve 123 is opened, and the pressure transmission gas (He) 104 supplies DVS-BCB monomer from the organic monomer tank 117 to the fluid flow indicator 105, via the organic monomer pipes 136a, 136b, and 136c, performing precise control of the DVS-BCB monomer supply speed as it is sent to the vaporization controller 106. Because of the conditions of a helium carrier gas flow of 500 sccm and a vaporization temperature of 150° C., the DVS-BCB monomer supply speed was made 0.03 g/minute. At this stage, the diaphragm valve 106h in the vaporization controller 106 is closed.

After the above, the diaphragm valve 106h in the vaporization controller 106 is opened, and the DVS-BCB monomer is vaporized. The vaporized DVS-BCB monomer is dispersed, together with the helium carrier gas by a shower head 118 in the reaction chamber 111, after which it is blown onto the silicon substrate 114. At the same time, high-frequency energy at 13.56 MHz is applied to the shower head 118 so as to generate a helium gas plasma in the reaction chamber 111, thereby promoting a ring opening reaction therewithin, so that at the surface of the substrate 114, which is heated to 300° C., polymerization of the DVS-BCB monomer occurs, resulting in the formation of a DVS-BCB polymer film (organic insulation film). If the monomer yield is 20%, to grow a 1-$\mu$m DVS-BCB film over an 8-inch substrate, it is necessary to supply approximately 0.15 g of DVS-BCB monomer. Therefore, DVS-BCB monomer is supplied from the liquid flow indicator for 5 minutes at a flow rate of 0.03 g/minute. When this is done, although unpolymerized DVS-BCB monomer remains in the exhaust pipe 140, the cooling trap that is water cooled to approximately 20° C. reliquifies the DVS-BCB monomer, so that it does not enter the exhaust pump 110.

After vaporizing a prescribed amount of DVS-BCB monomer, the diaphragm valve 106h in the vaporization controller 106 is closed. After this, the valve 130 is closed, thereby stopping the flow of helium carrier gas 102, and the silicon substrate 114 is removed from the reaction chamber 111.

Figure 15:
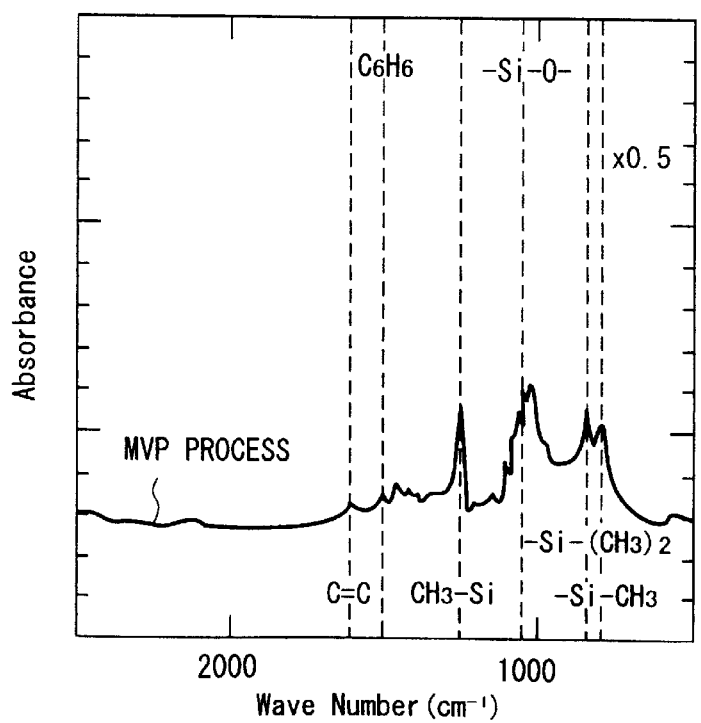
FIG. 15 is a graph showing the infrared absorbance characteristics of a DVS-BCB high polymer form using a polymer film forming apparatus.
Figure 16:
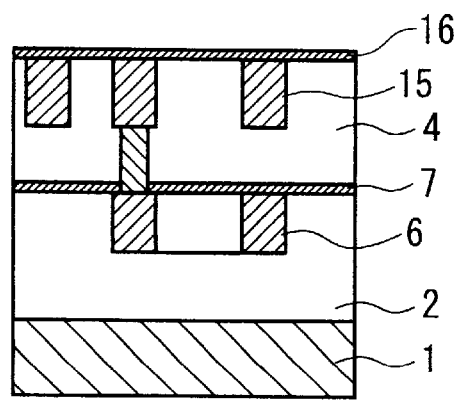
FIG. 16 is a cross-section view showing an interconnection structure according to the first past example.
Figure 17:
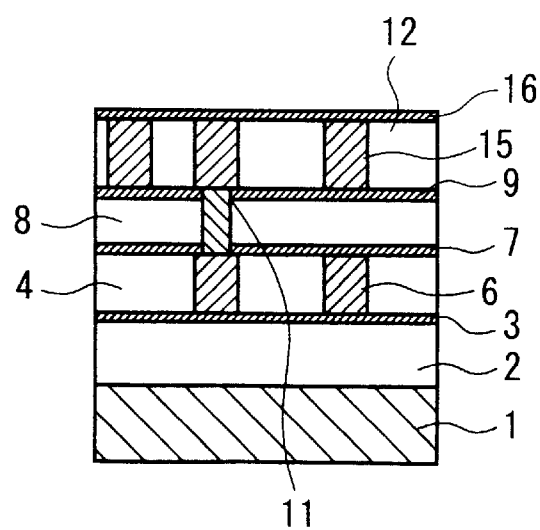
FIG. 17 is a cross-section view showing an interconnection structure according to the second past example.

FIG. 15 shows the infrared absorbance spectrum of a DVS-BCB polymer film obtained from DVS-BCB monomer vaporized by the polymer film growing apparatus according to the present invention. The dielectric constant of the DVS-BCB polymer film was 2.7.

Figure 1:
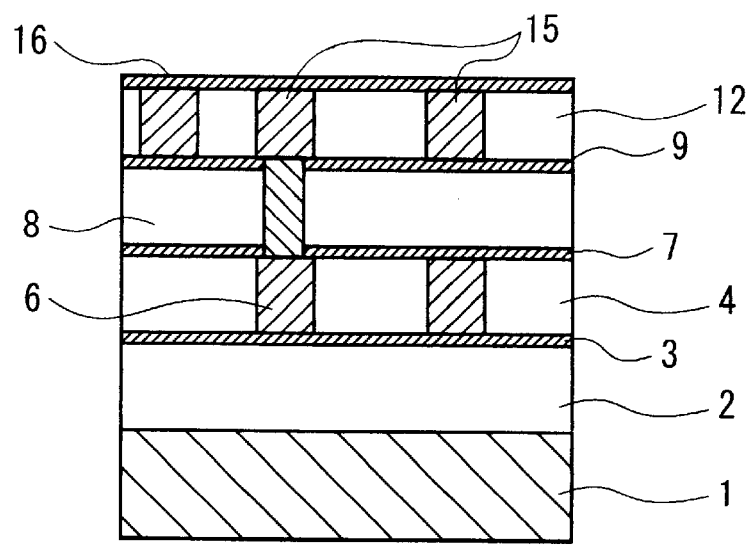
Figure 2:
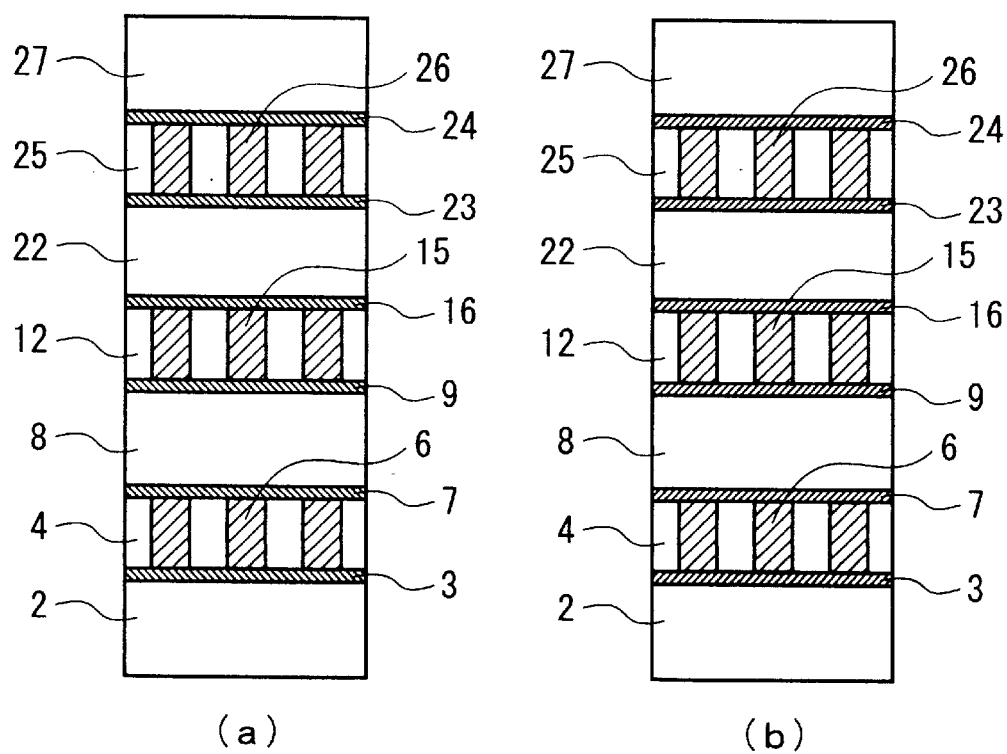
Figure 3:
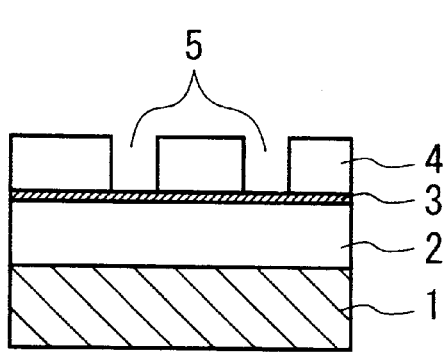
Figure 3:
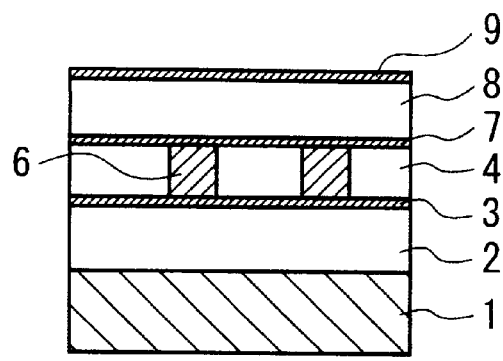
Figure 3:
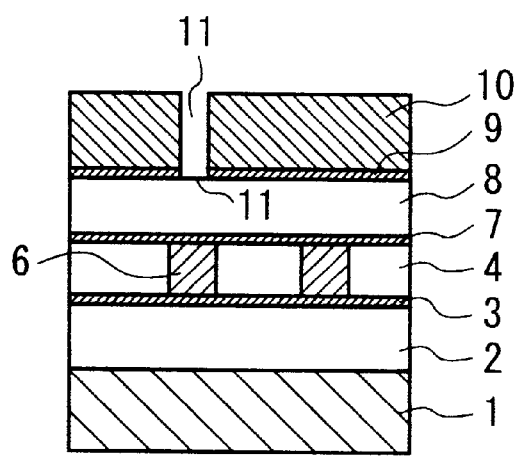
Figure 3:
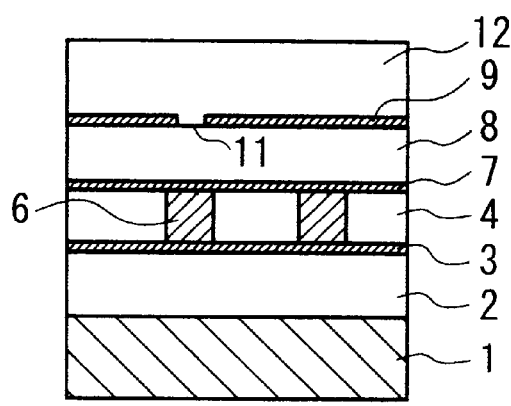
Figure 4:
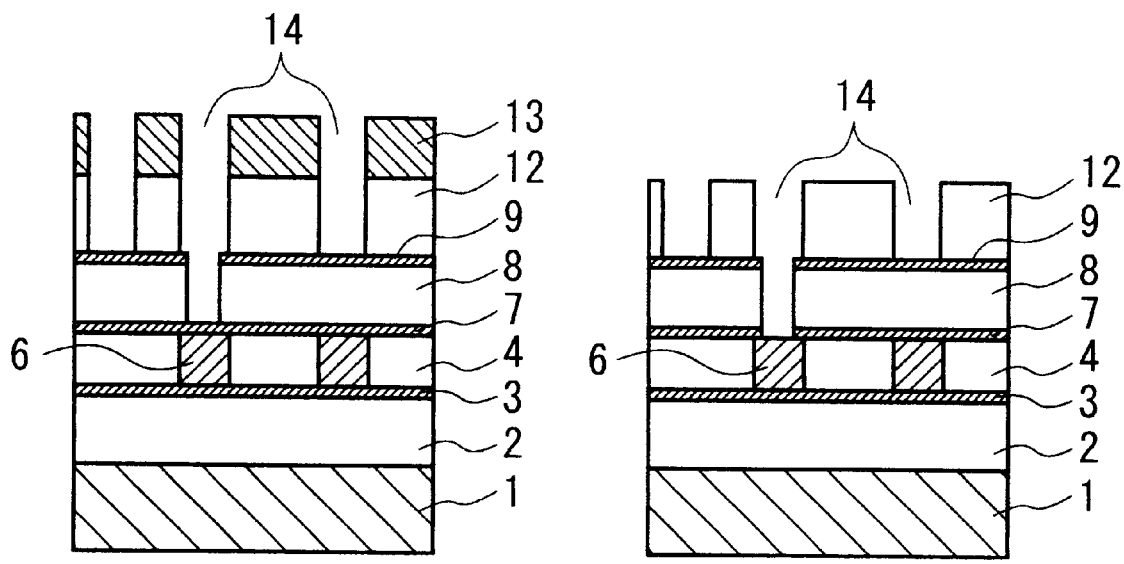

FIG. 3 and FIG. 4 show embodiments in which the DVS-BCB film obtained by the above PE-MVP method is applied to an interconnection protective film and an etching stop film in the semiconductor device.

The etching stop film used in this case can also be an organic film grown using plasma generated from an organic siloxane, such as methyl siloxane, as the raw material.

FIG. 3 and FIG. 4 are cross-section views showing the various process steps in manufacturing a multilayer inlayed interconnection structure. For example, on a substrate 1 onto which a transistor (not shown in FIGS. 3 and 4) is formed a first insulation film 2 is formed, and a contact plug extending to the transistor diffusion layer (not shown in FIG. 3 and FIG. 4) is formed, after which a first etching stop film 3 and then a second insulation film 4 are formed. A film having lower dielectric constant than the first or second insulation film is used as the first etching stop film 3. In this case, a silicon oxide film (with a dielectric constant of 4) was used as the first and second insulation films 2 and 4, and a benzocyclobutene (BCB) film grown by the above-described MVP method (and having a dielectric constant of 2.7) was used as the first etching stop film 3. The thickness of the first and second insulation films 2 and 4 are 600 nm and 300 nm, respectively, and that of the first etching stop film is 100 nm. It is sufficient for the etching stop film 3 used herein, to have an etching rate that is sufficiently slower than that of the second insulation film 4, and to have a dielectric constant that is the same as or lower than the first and second insulation films 2 and 4. For example, this embodiment uses $CHF_3$ as the etching gas, with which the etching rate of the silicon oxide film is 600 nm/minute, and the etching rate of the BCB film is 110 nm/minute, making the etching selectivity ratio greater than 5.

Additionally, after forming the first resist layer (not shown in the drawing) on the second insulation film 4, a first interconnection layer pattern is formed. Using this pattern as a mask, the second insulation film 4 is etched, thereby forming the first aperture 5. The etching gas used is $CHF_3$. As noted above, by using a silicon oxide film as the second insulation film 4, by using BCB as the first etching stop film 3, because of the existence of the first etching stop film 3, the first aperture 5 is formed with its bottom formed by the first etching stop film 3.

After the above, the resist layer is removed (FIG. 3 (a)), the resist layer being selectively removed by using chemical remover.

Additionally, a conductive film is formed over the first etching stop film 3 and second insulation film 4, so as to fill the first aperture 5. Then, CMP or the like is used to polish the surface, so that this metal film remains only in the first aperture 5, so as to form the first interconnection layer. Copper was used as the conductive film, and before forming the copper film a titanium nitride film was used as a liner film. The titanium nitride film was formed by the MOCVD process, with the substrate temperature in the range from 250° C. to 350° C., and the thickness of the titanium nitride film was 10 nm. The copper film was formed by the MOCVD process, with the substrate temperature in the range from 140° C. to 240° C., and the thickness of the copper was 0,5 $\mu$m. Additionally, copper and titanium in parts other than the aperture is removed by using an alumina-based slurry in a CMP process. When this is done, the rotational speeds of the polishing pad and the substrate were 500 rpm and 60 rpm, respectively. The polishing pressure is 0.24 kg/cm$^2$.

After forming the first interconnection layer 6, a first interconnection protective film 7 is formed on the combined surface of the second insulation film 4 and the first interconnection layer, and then the third insulation film 8 and the second etching stop film 9 are formed (FIG. 3 (b)). The first interconnection protective film 7 and second etching stop film 9 have dielectric constants, similar to the case of the first etching stop film 3, which are lower than the first, second, and third insulation films 2, 4, and 8. It is sufficient for the etching stop film 9 used herein, under the etching conditions used when forming the second aperture 11, to have an etching rate that is sufficiently slower than that of the fourth insulation film 12, and to have a dielectric constant that is the same as or lower than the third and fourth insulation films 8 and 12. Herein, similar to the second insulation film 4 and the first etching stop film 3, as the third insulation film 8 a silicon oxide film (300 nm) is used, and as the second etching stop film 9 (100 nm), benzocyclobutene (BCB) is used, the etching gas used being $CHF_3$. The first interconnection protective film 7, as described above, is grown in a vacuum chamber. The first interconnection protective film 7 (100 nm) is a benzocyclobutene (BCB) film that is grown using the above-noted MVP process. By doing this, when forming the interconnection protective film , there is no oxidation of the copper of the first interconnection 6. Furthermore, by using a film having a dielectric constant that is lower than that of the insulation film, it is possible to effectively reduce the capacitance between interconnections.

After forming the second etching stop film 9, the second resist layer 10 is formed with the thickness of 700 nm, and a second aperture pattern is formed. Using this pattern as a mask, the second etching stop film 9 is etched, thereby forming the second aperture 11 (FIG. 3 (c)). A mixture of $CHF_3$ and oxygen is used to etch the BCB film 9. If the ratio of $CHF_3$ to oxygen is 1:1, the etching rates of the BCB film 9, which is the second etching stop film, and the silicon oxide film 8, which is the third insulation film, are 750 nm/minute and 130 nm/minute, respectively, making the etching selectivity ratio greater than 5. Therefore, the second aperture 11 is formed so as to have the third insulation film 8 as its bottom.

After the above, the resist layer 10 is removed.

Onto the second etching stop film 9, in which is formed the second aperture 11, the fourth insulation film 12 is formed with the thickness of 300 nm. The fourth insulation film uses a silicon oxide film (300 nm).

Additionally, on the fourth insulation film 12, are formed a third resist layer 13 with the thickness of 700 nm and then forming the second interconnection pattern. Using this pattern as a mask, the fourth insulation film 12 is etched, thereby forming the third aperture 14. The etching gas used is $CHF_3$. When this is done, similar to the case of the first aperture 5, because of the existence of the second etching stop film 9, the third aperture 14 having the second etching stop film 9 as its bottom is formed (FIG. 4(a)). The etching at the second aperture 11 formed in the second etching stop film 9 progresses further, so as to pass through the third insulation film 8, and form the second aperture 11 that reaches to the first interconnection protective film 70. When this is done, the first interconnection protective film 7 also functions as an etching stop film, because of the existence of the first interconnection protective film 7, the second aperture 11 is formed with the first interconnection protective film 7 as its bottom (FIG. 4(a)).

After forming the second and third apertures 11 and 14, the third resist layer 13 is removed, this being done by selective peeling with chemical remover. After that, the second aperture 11 is used to etch the first interconnection protective film 7 (FIG. 4(b)).

After the above, a conductive film is deposited so as to fill the aperture, and then a CMP process or the like is used to polish the surface, so that the conductive film is left only in the aperture, thereby forming the second interconnection layer 15. Copper is used for the conductive film, and a titanium nitride film is used as a liner film before growing the copper film. In the second interconnection layer as well, the film growth conditions for the copper and titanium nitride films are the same as for the first interconnection layer 6. The removal of the copper and the titanium nitride films is also the same as the first interconnection layer, this being done by a CMP process.

After forming the second interconnection layer 15, a second interconnection protective film 16 is formed over the combined surface of the fourth insulation film 12 and the second interconnection layer 15 (FIG. 4(c)). Similar to the case of the first interconnection protective film 7, the benzocyclobutene (BCB) film is formed to a thickness of 100 nm, using the above-noted MCP process.

Because, similar to the case of the second etching stop film 9, the second interconnection protective film 16 has a dielectric constant that is lower than the first, second, or third insulation films 2, 4, and 8, and is also grown in a vacuum chamber, when the interconnection protective film is formed, the is no oxidation of the copper that forms the second interconnection layer 15. Furthermore, by using a film having a dielectric constant lower than the insulation film, it is possible to effectively reduce the capacitance between interconnections.

Example 2

The second embodiment of the present invention will be described with reference to FIG. 5 and FIG. 6. In this embodiment as well, similar to the first embodiment, an organic film grown in a vacuum chamber is used as an interconnection protective film on the top of a copper interconnection layer. While it is at present an undisclosed technology, the inventors proposed, in Japanese Patent Application No. 10-266851, new method of forming a functional organic polymer film using the vaporization of an organic monomer. In this method, an organic monomer is directly vaporized and the monomer within the vapor phase is polymerized onto a substrate, so as to obtain the organic polymer film. The case of using a DVS-BCB (divinyl siloxane benzocyclobutene) film is described below.

The etching stop film used herein can be an organic film grown using plasma generated from an organic siloxane, such as methyl siloxane, as the raw material.

Figure 5:
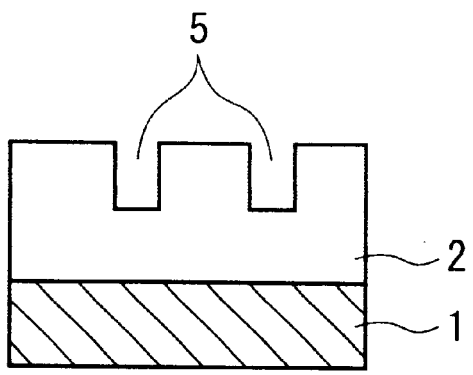
Figure 5:
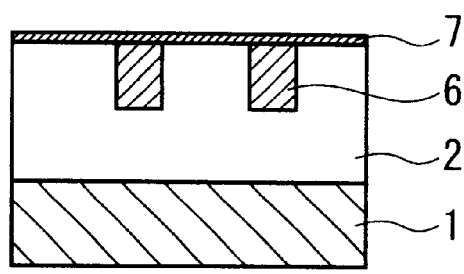
Figure 5:
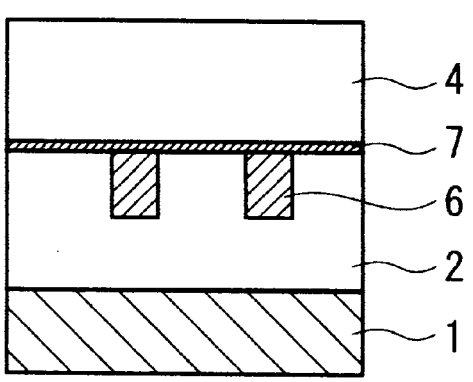
Figure 5:
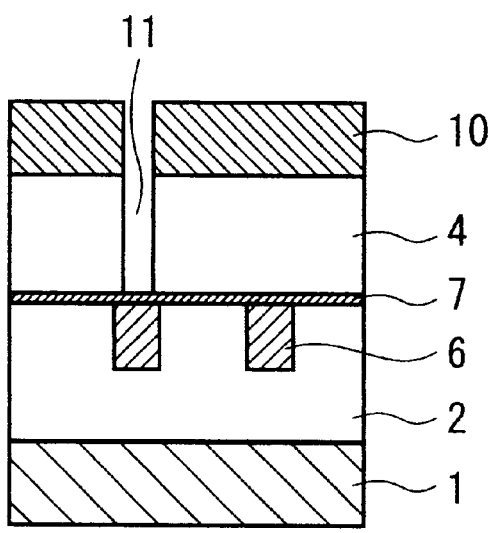
Figure 6:
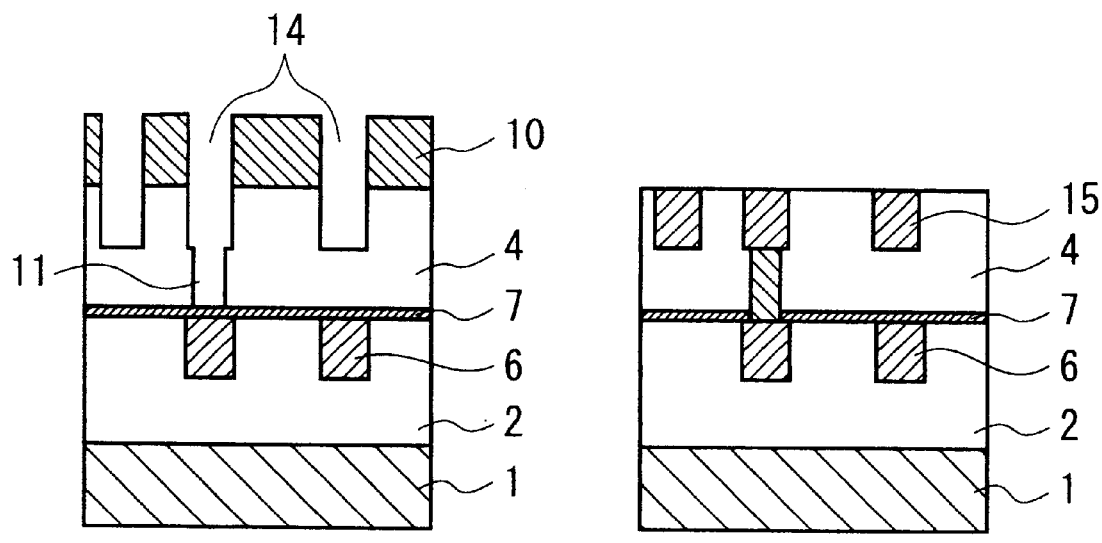

FIG. 5 and FIG. 6 are cross-section views showing the various process steps in manufacturing a multilayer inlayed interconnection structure. For example, a first insulation film 2 is formed on a semiconductor substrate 1 onto which is formed a transistor (not shown in FIG. 5 and FIG. 6), and a contact plug extending to the transistor diffusion layer (not shown in FIG. 5 and FIG. 6) is formed. In this case a silicon oxide film (1 $\mu$m) was used. Then, a first resist layer (not shown in the drawing) is formed on the first insulation film 2, so as to form a first interconnection layer pattern. Using this interconnection layer pattern as a mask, the first insulation film 2 is etched, thereby forming the first aperture 5. The depth of the interconnection is made 300 nm, by controlling the etching time. After that, the resist layer is removed (FIG. 5(a)). In this process, etching is done with $CHF_3$ as the etching gas and the resist is removed by using an oxygen plasma.

After the above, a conductive film is deposited onto the first insulation film 2, so as to fill the first aperture 5. Then, CMP or the like is used to polish away the conductive film, so that it remains only in the first aperture 5, thereby forming the first interconnection layer 6. Copper is used as the conductive film, and a liner film of titanium nitride was used immediately before forming the copper film. The titanium nitride film was formed to a thickness of 10 nm, by an MOCVD process, with the substrate temperature in the range from 250° C. to 350° C. The copper was deposited to a thickness of 0.5 $\mu$m using an MOCVD process, with the substrate temperature between 140° C. and 240° C. To remove the copper and titanium nitride films in parts other than the aperture, an alumina-based slurry was used with a CMP process. When this is done, the rotational speeds of the polishing pad and the substrate were 500 rpm and 60 rpm, respectively. The polishing pressure is 0.24 kg/cm$^2$.

After forming the first interconnection layer 6, the first interconnection protective film 7 is formed on the combined surface of the first insulation film 2 and the first interconnection layer 6 (FIG. 5(b)), then the second insulation film 4 is formed. The first interconnection protective film 7 is a film having a dielectric constant that is lower than the first or second insulation films 2 and 4. In this embodiment, for the second insulation film 4 a silicon oxide film (700 nm) is used, and for the first interconnection protective film 7 a benzocyclobutene (BCB) film (100 nm) formed as noted above by an MVP process is used. The first insulation film 7 is formed inside a vacuum chamber. By doing this, when forming the interconnection protective film 7, there is no oxidation of the copper of the first interconnection layer 6. It is desirable that the interconnection protective film 7, under the etching conditions for forming the second aperture 11, have an etching rate that is sufficiently slower than that of the second insulation film 4 and also that the dielectric constant of the interconnection protective film 7 is equal to or smaller than that of the first and second insulation films 2 and 4. Furthermore, by using a film having a dielectric constant that is smaller compared with the insulation film, it is possible to effectively reduce the capacitance between interconnections.

After forming the second insulation film 4, the second resist layer (700 nm) 10 is formed, so as to form the second aperture 11 pattern. Using this pattern as a mask, the second insulation film 4 is etched, so as to form the second aperture 11 (FIG. 5(d)). The etching is performed using $CHF_3$ as the etching gas. As described above, because a silicon oxide film is used as the second insulation film 4, and BCB is used as the first interconnection protective film 7, the first interconnection protective film 7 also serves as an etching stop film, and the presence of the first interconnection protective film 7 causes the second aperture 11 to be formed with the first interconnection protective film 7 as its bottom part.

After the above, the second resist layer 10 is selectively removed using chemical remover.

After forming a third resist layer 13 (700 nm) on the second insulation film 4 in which is formed the second aperture 11, the second interconnection pattern is formed. Using this pattern as a mask, the second insulation film 4 is etched, thereby forming the third aperture 14 (FIG. 6(a)). In forming the third aperture 14, the depth of the third aperture 14 is made 300 nm, by controlling the etching time.

After forming the second and third apertures 11 and 14, the third resist layer 13 is selectively removed using chemical remover.

After the above, using the second aperture 11, the first interconnection protective film 7 is etched. To prevent oxidation of the interconnection surface during etching, it is desirable that the etching gas does not contain oxygen, even if the etching speed is reduced. In this case, $CHF_3$ was used as the etching gas. In the etching of the BCB, although the mixture of oxygen increases the etching rate, to prevent oxidation, only $CHF_3$ was used.

After the above, a conductive film is deposited over the second insulation film 4, so as to fill the second and third apertures 11 and 14. Then CMP or the like is used to polish away this conductive film, so that it remains only in the second and third apertures 11 and 14, so as to form the second interconnection layer 15 (FIG. 6(b)). In this case, copper is used as the conductive film, and a titanium nitride film is used as a liner film before formation of the copper film. In the second interconnection layer 15 as well, the conditions for forming the copper and the titanium nitride films are the same as for the first interconnection layer. The removal of the copper and titanium nitride films is performed, as is the case for the first interconnection layer, using a CMP process.

After forming the second interconnection layer 15, a second interconnection protective film 16 is formed on the combined surface of the second insulation film 4 and the second interconnection layer 15 (FIG. 6(c)). Similar to the case of the second etching stop film 9, the second interconnection protective film 16 has a dielectric constant that is lower than the first or second insulation film 2 or 4, and is formed in a vacuum chamber. The above-noted MVP process is used to form a benzocyclobutene (BCB) film (100 nm) as the second interconnection protective film 16. For this reason, when the interconnection protective film 16 is formed, there is no oxidation of the copper of the second interconnection layer 15. Furthermore, by using a film having a lower dielectric constant than the insulation film, it is possible to effectively reduce the capacitance between interconnections.

Example 3

The third embodiment of the present invention is described below, with reference made to FIG. 7 and FIG. 8.

In this case as well, similar to the first embodiment, an organic film formed in a vacuum chamber is used as an interconnection protective film on the top of the copper interconnection layer. While it is at present an undisclosed technology, the inventors proposed, in Japanese Patent Application No. 10-266851, new method of forming a functional organic polymer film using the vaporization of an organic monomer. In this method, an organic monomer is directly vaporized and the monomer within the vapor phase is polymerized onto a substrate, so as to obtain the organic polymer film. The case of using a DVS-BCB (divinyl siloxane benzocyclobutene) film is described below.

The etching stop film used herein can be an organic film grown using plasma generated from an organic siloxane, such as methyl siloxane, as the raw material.

Figure 7:
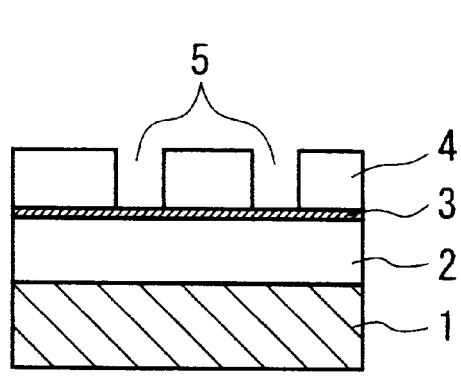
Figure 7:
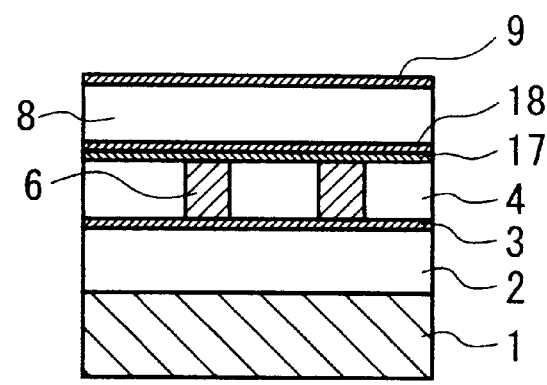
Figure 7:
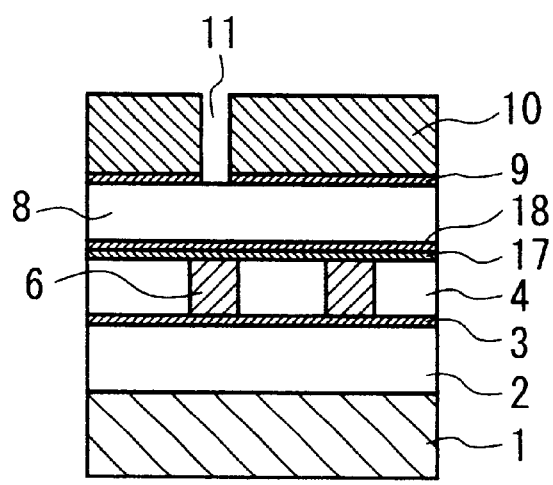
Figure 7:
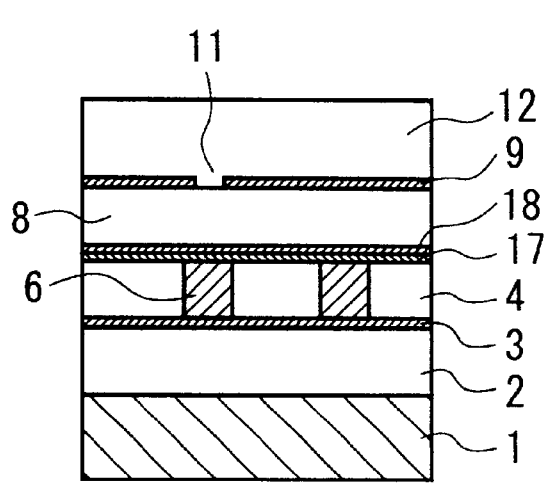
Figure 8:
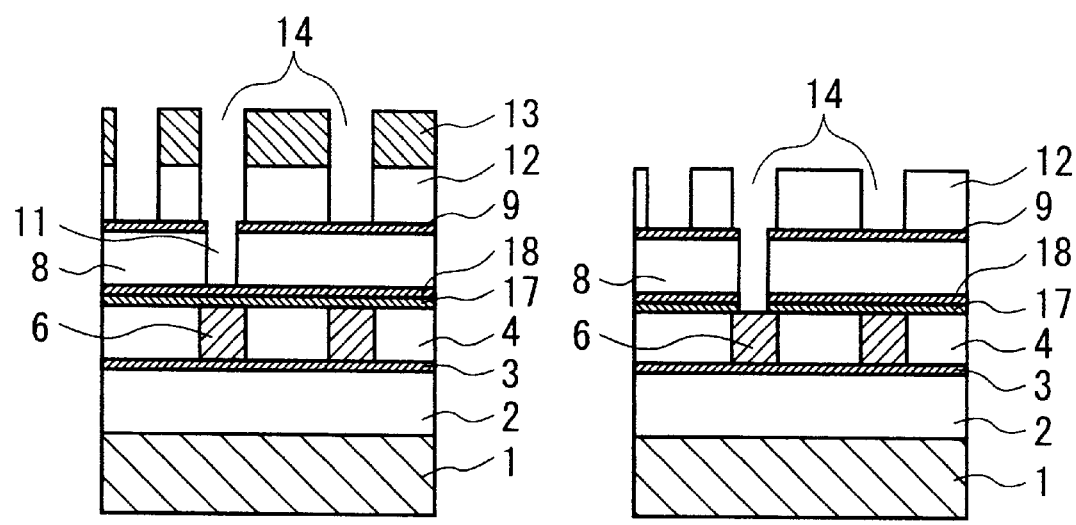

FIG. 7 and FIG. 8 are cross-section views showing the process steps for a multilayer interconnection structure. For example, a first insulation film 2 is formed on a semiconductor substrate 1 onto which is formed a transistor (not shown in FIG. 7 and FIG. 8), and a contact plug extending to the transistor diffusion layer (not shown in FIG. 7 and FIG. 8) is formed, after which a first etching stop film 3 and a second insulation film 4 are formed. For the first and second insulation films 2 and 4, silicon oxide films (the film thickness is 600 nm and 300 nm, respectively) were used, and for the first etching stop film 3 a silicon oxinitride (SiON) film (100 nm) was used. It is desirable that the etching stop film 3, under the etching conditions for forming the first aperture 5, have an etching rate that is sufficiently slower than that of the second insulation film 4. For example, if the etching is done with a $C_4F_8/Ar/CO$ gas mixture as the etching gas, the etching rate of the silicon oxinitride film is 1/50 of the etching rate of a silicon oxide film.

Additionally, after forming a first resist layer (not shown in the drawing) on the second insulation film 4, a first interconnection pattern is formed. Using this pattern as a mask, the second insulation film 4 is etched, thereby forming the first aperture 5. The etching gas used for this was a $C_4F_8/Ar/CO$ gas mixture. As noted above, by using a silicon oxide film for the second insulation film 4 and using an SiON film as the first etching stop film 3, the first aperture 5 is formed with the first etching stop film 3 as its base part. After that, the resist layer is removed (FIG. 7(a)), this being done with an oxygen plasma.

Additionally, a conductive film is deposited on the first etching stop film 3 and the second insulation film 4, so as to fill the first aperture 5. Then, CMP or the like is done to polish away the conductive film, so that it remains only in the first aperture 5. Copper is used as this conductive film, and titanium nitride is used as a liner film. The titanium nitride film is formed to a thickness of 10 nm by an MOCVD process, with the substrate temperature in the range from 250° C. to 350° C., and the copper film is formed to a thickness of 0.5 $\mu$m by an MOCVD process, with the substrate temperature in the range from 140° C. to 240° C. Additionally, the copper and titanium nitride films in parts other than the aperture 5 are removed by polishing with an alumina-based slurry, by a CMP process. When this is done, the rotational speeds of the polishing pad and the substrate were 500 rpm and 60 rpm, respectively. The polishing pressure is 0.24 kg/cm$^2$.

After forming the first interconnection layer 6, a first interconnection protective film (lower layer) 17 and a second interconnection protective film (upper layer) 18 are formed on the combined surface of the second insulation film 4 and the first interconnection layer 6, and a third insulation film 8 and second etching stop film 9 are further formed (FIG. 7 (b)). Both the upper layer and lower layer of the interconnection protective film are 100 nm thick, and the film thickness of the third insulation film 8 and second etching stop film 9 were made 300 nm and 100 nm, respectively. The first interconnection protective film (lower layer) 17 has a dielectric constant that is lower than the first, second, or third insulation film 2, 4, or 8. In this structure, a silicon oxide film (with a dielectric constant of 4) was used for the third insulation film 8, a silicon oxinitride film (SiON, with a dielectric constant of 7) was used for the second etching stop film 9, and a benzocyclobutene (BCB) film (with a dielectric constant of 2.7) grown using the above-noted MVP process was used for the first interconnection protective film (lower layer). It is sufficient in this structure for the etching stop film 9 and the first interconnection protective film (upper layer) 18 to have an etching rate that, under the conditions for etching the second aperture 11, is slower than the etching rate of the third insulation film 8. For example, if etching is done with a $C_4F_8$/Ar/CO gas mixture as the etching gas, the etching rate of the silicon oxinitride film is 1/50 of the etching rate of a silicon oxide film.

The first interconnection protective film (lower layer) 17 is formed within a vacuum chamber. A benzocyclobutene (BCB) film grown using the above-noted MVP process is used for the first interconnection layer (lower layer) 17. By doing this, the copper of the first interconnection layer 6 is not caused to oxidize when the first interconnection protective film (lower layer) 17 is formed. Furthermore, by using a film having a dielectric constant that is lower than the insulation film, it is possible to make the capacitance between adjacent interconnections small, thereby effectively reducing the capacitance between interconnections.

After forming the second etching stop film 9, the second resist layer 10 (700 nm) is formed, thereby forming the pattern for the second aperture 11. Using this pattern as a mask the second etching stop film 9 is etched, so as to form the second aperture 11. For this etching, $CH_3$ is used as the etching gas. Then the second resist layer 10 is removed using an oxygen plasma.

A fourth insulation film 12 is formed over the second etching stop film 9, in which is formed the second aperture 11 (FIG. 7(d)). The fourth insulation film 12 is a silicon oxide film with a film thickness of 300 nm. Additionally, after forming a third resist layer 13 (700 nm) on the fourth insulation film 12, the second etching pattern thereon is formed. Using this pattern as a mask, the fourth insulation film 12 is etched, thereby forming the third aperture 14. In this embodiment, as the fourth insulation film is made of a silicon oxide film and the second etching stop film 9 is made of a silicon oxinitride film, when etching by using a $C_4F_8$/Ar/CO gas plasma as the etching gas, the etching rate of the of the silicon oxinitride film 9, which is the second etching stop film, is approximately 1/50 of the etching rate of the silicon oxide film 12, which is the fourth insulation film, and the existence of the second etching stop film 9 causes the formation of a third aperture 14 having the etching stop film 9 as its bottom part (FIG. 8(a)). As etching at the second aperture 11 formed in the second etching stop film 9 progress further, a second aperture 11 is formed which passes through the third insulation film 8 and reaches to the first interconnection protective film (upper layer) 18, thereby forming the second aperture 11. Because the first interconnection protective film (upper layer) 18 also serves as an etching stop film, the existence of the first protective film (upper layer) 18 causes the formation of the second aperture 11, which has the first interconnection protective film (upper layer) 18 as its bottom part.

After the second and third apertures 11 and 14 are formed, the third resist layer 13 is removed using an oxygen plasma.

After the above, using the second aperture 11, both the upper layer 18 and the lower layer 17 of the first interconnection protective film are etched, thereby completing the second aperture 11. In order that the interconnection surface is not caused to oxidize during the etching, it is desirable that the etching gas does not contain oxygen, even if the etching speed is reduced. In this case, $CHF_3$ was used as the etching gas. In the etching of the BCB, the mixture of oxygen increases the etching rate. However, to prevent oxidation, only $CHF_3$ was used.

After the above, a conductive film is deposited to fill the second and third apertures 11 and 14. Then, CMP or the like is used to polish away this conductive film, so that it remains only in the second and third apertures, thereby forming the second interconnection layer 15. In this case, copper is used as the conductive film, and a titanium nitride film is formed as a liner film before formation of the copper film. In the second interconnection layer 15 as well, the conditions for forming the copper and the titanium nitride films are the same as for the first interconnection layer 6. The removal of the copper and titanium nitride films is performed, as is the case for the first interconnection layer, using a CMP process.

After forming the second interconnection layer 15, the second interconnection protective film (lower layer) 19 and second protective film (upper layer) 20 are formed on the combined surface of the third insulation film 12 and the second interconnection layer 15 (FIG. 8(c)). The above-noted MVP process is used to form a benzocyclobutene (BCB) film (100 nm, with a dielectric constant of 2.7) as the second interconnection layer protective film (lower layer) 19, and a silicon oxinitride film (100 nm) is used to as the second interconnection layer protective film (upper layer) 20. It is desirable that the etching stop film (upper layer) 20 have an etching rate, under the etching conditions for forming the aperture, that is sufficiently slower than that of the insulation film. For example, in etching using a $C_4F_8$/Ar/CO gas mixture plasma, the etching rate of the silicon oxinitride film is approximately 1/50 of the etching rate of a silicon oxide film. Because the dielectric constant of the second interconnection layer protective film (lower layer) 19 is lower than the dielectric constant of the first, second, or third insulation films 2, 4, and 8, and because the film is formed in a vacuum chamber, there is no oxidation of the copper of the second interconnection layer 15 when the interconnection protective film is formed. Furthermore, by using a film with a dielectric constant that is lower than the insulation film, it is possible to effectively reduce the capacitance between interconnections.

Example 4

The fourth embodiment of the present invention is described below, with references made to FIG. 9 and FIG. 10.

In this embodiment as well, similar to the first embodiment, an organic film grown in a vacuum chamber is used as an interconnection protective film on the top of a copper interconnection layer. While it is at present undisclosed technology, the inventors proposed, in Japanese Patent Application No. 10-266851, a new method of forming a functional organic polymer film using the vaporization of an organic monomer. In this method, monomer within the vapor phase is polymerized onto a substrate, so as to obtain an organic polymer film. The case of using a DVS-BCB (divinyl siloxane benzocyclobutene) film, which can be grown within a vacuum chamber is described below.

The etching stop film used herein can be an organic film grown using plasma generated from an organic siloxane, such as methyl siloxane, as the raw material.

Figure 9:
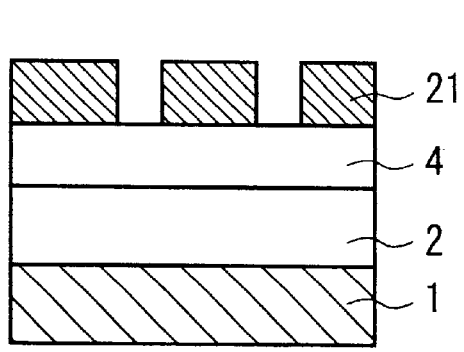
Figure 9:
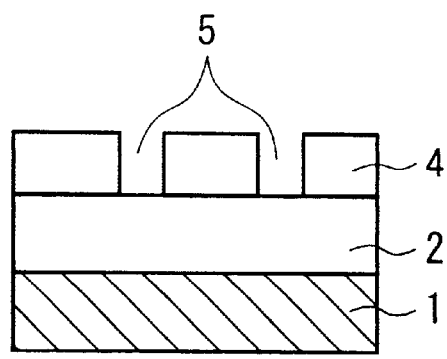
Figure 9:
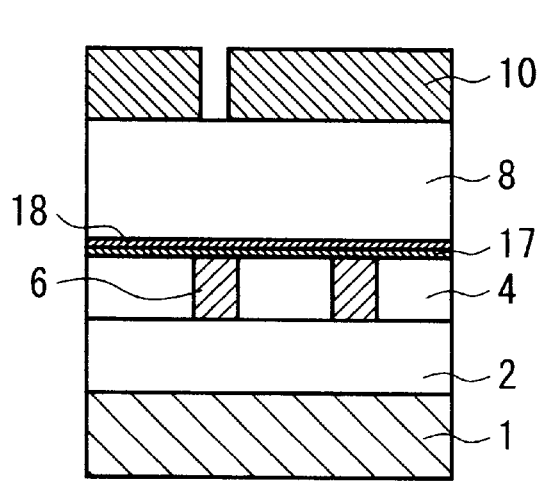
Figure 9:
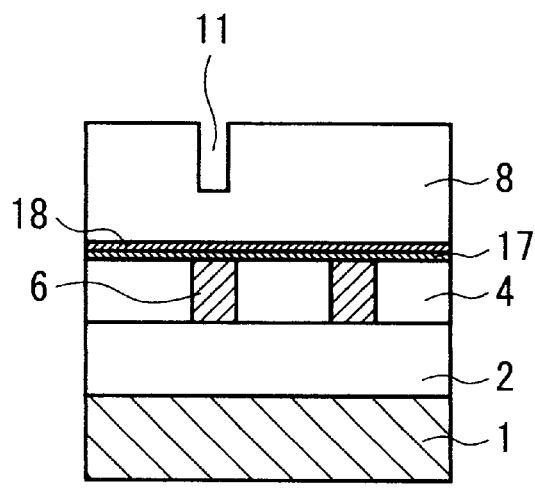
Figure 10:
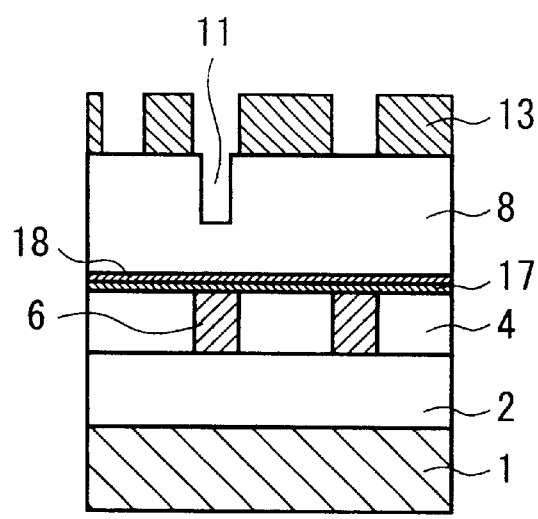
Figure 10:
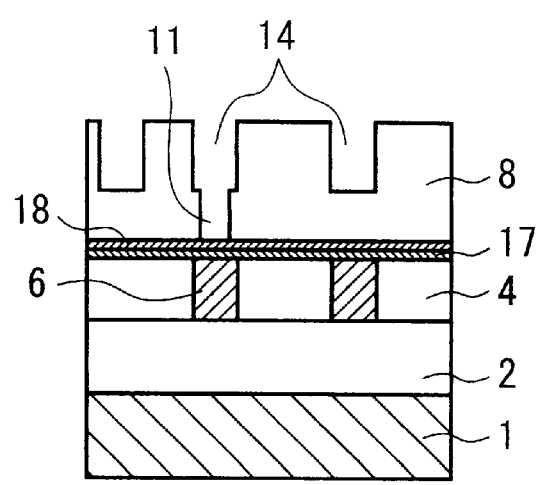
Figure 10:
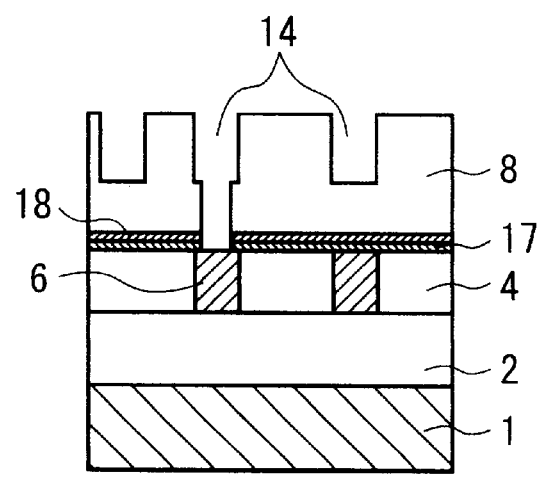
Figure 10:
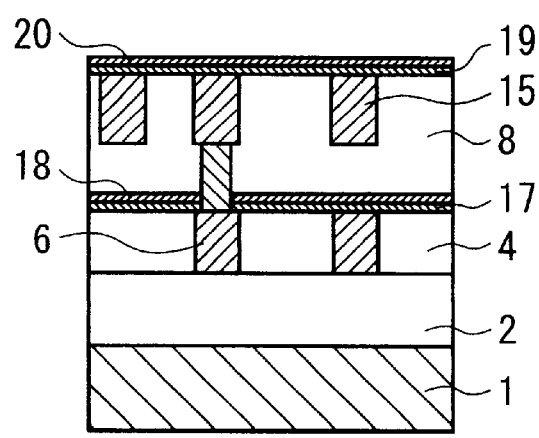

FIG. 9 and FIG. 10 are cross-section views showing the various process steps in manufacturing a multilayer inlayed interconnection structure. For example, a first insulation film 2 is formed on a semiconductor substrate 1 onto which is formed a transistor (not shown in FIG. 9 and FIG. 10), and a contact plug (not shown in FIG. 5 and FIG. 6) extending to the transistor diffusion layer is formed, after which a second insulation film 4 is formed. In this case a silicon oxide film (600 nm) was used as the first insulation film 2, and a DVS-BCB divinyl benzocyclobutene film (300 nm) was used for the second insulation film 4. Then, a first resist layer 21 is formed on the second insulation film 4, after which an etching pattern for the first interconnection layer is formed (FIG. 9(a)). Using this pattern as a mask, the second insulation film 4 is etched, thereby forming the first aperture 5, using a $CHF_3/O_2$ gas mixture as the etching gas. For a $CHF_3/O_2$ mixture ratio of 90:10, the etching ratio between the resist and the BCB is substantially 1, so that the etching rates thereof are substantially the same. Therefore, as etching progresses, the resist layer 21 is etched back, and in an area in which there is no resist, the BCB film that forms the second insulation film 4 is etched at an equal rate, thereby forming the aperture 5. By controlling the thickness of the resist 21 and the etching time, not only is a first aperture 5 having the first insulation film as its bottom part obtained (FIG. 9(b)), but it is also possible to form a trench for the interconnection layer and peel a resist, thereby reducing the number of process steps for fabricating a multilayer interconnection structure.

Additionally, a conductive film is deposited on the second insulation film 4, so as to fill the first aperture 5. Then, CMP or the like is used to polish away the conductive film, so that it remains only in the first aperture 5, thereby forming the first interconnection layer 6. In this structure, copper is used for the conductive film, and a titanium nitride film is formed as a liner film before the formation of the copper film. The titanium nitride film is formed to a thickness of 10 nm by an MOCVD process, with the substrate temperate in the range from 250° C. to 350° C. The copper film is grown to a thickness of 0.5 μm using an MOCVD process, with the substrate temperature in the range from 140° C. to 240° C. The copper and titanium nitride film in parts other than the aperture are removed by using a CMP process with an alumina-based slurry. When this is done, the rotational speeds of the polishing pad and the substrate were 500 rpm and 60 rpm, respectively. The polishing pressure is 0.24 $kg/cm^2$.

After forming the first interconnection layer 6, a first interconnection protective film (lower layer) 17 and a second interconnection protective film (upper layer) 18 are formed on the combined surface of the second insulation film 4 and the first interconnection layer 6, and a third insulation film 8 is further formed. The upper layer and lower layer of the interconnection protective film are 200 nm and 100 nm thick, respectively, and the third insulation film 8 is 700 nm thick. The first interconnection protective film (lower layer) 17 uses a film that has a dielectric constant that is lower than the first interconnection protective film (upper layer) 18. A silicon oxide film with a dielectric constant of 4 is used as the first interconnection protective film (upper layer) 18, and a benzocyclobutene (BCB) film (dielectric constant 2.7) grown by the above-noted MVP process is used as the third insulation film 8 and the first interconnection protective film (lower layer) 17.

Additionally, a benzocyclobutene (BCB) film grown by the above-noted MVP process in a vacuum chamber is used for the first interconnection protective film (lower layer) 17, the result being that there is no oxidation of the copper of the first interconnection layer 6 when the interconnection protective film (lower layer) is formed. Furthermore, by using a film having a dielectric constant that is lower than that of the first interconnection protective film (upper layer) 18, it is possible to reduce the capacitance between interconnections.

After the third insulation film 8 is formed, a second resist layer 10 (700 nm) is formed, thereby forming the etching pattern for the second aperture. Using this pattern as a mask, the third insulation film 8 is etched, thereby forming the second aperture 11. The etching gas used, similar to the formation of the first aperture 5, is a $CHF_3/O_2$ gas mixture. For a $CHF_3/O_2$ mixture ratio of 90:10, the etching ratio between the resist 10 and the BCB 8 is substantially 1, so that as etching progresses the resist layer 10 is etched back, and in an area in which there is no resist, the BCB film 8 that forms the third insulation film is etched at an equal rate, thereby forming the aperture 11. By controlling the etching time of the resist 10, a second aperture 11 having the third insulation film 8 as its bottom part obtained (FIG. 9(d)).

A third resist layer 13 (700 nm) is formed on the third insulation film 8, in which is formed the second aperture (FIG. 10(a)). Using this pattern as a mask, the third insulation film 8 is etched, thereby forming the third aperture 14. The etching gas used in this case, similar to the case of forming the first and second apertures 5 and 11, is a $CHF_3/O_2$ gas mixture. For a $CHF_3/O_2$ mixture ratio being 90:10, the etching ratio between the resist and the BCB is substantially 1, so that as etching progresses the resist layer is etched back, and in an area in which there is no resist, the BCB film that forms the second insulation film is etched at an equal rate, thereby forming the aperture 11. By controlling the thickness of the resist, a first aperture 11 having the second insulation film 8 as its bottom part obtained (FIG. 9(d)).

A third resist layer 13 (700 nm) is formed on the third insulation film, in which is formed the second aperture 11

(FIG. 10(a)). Using this pattern as a mask, the third insulation film 8 is etched, thereby forming the third aperture 14. The etching gas used in this case, similar to the condition for forming the first and second apertures 5 and 11, is a $CHF_3/O_2$ gas mixture, the $CHF_3/O_2$ mixture ratio being made 90:10. As the etching progresses, the third resist layer 13 is etched back, and the parts of the BCB film forming the third insulation film on which there is no resist are etched at the same rate, thereby forming the aperture 14 (FIG. 10(b)). As the etching of the second aperture 11 progresses, a second aperture 11 which passes through the third insulation film 8 is formed and reaches the first interconnection protective film (upper layer) 18.

It is desirable that the first interconnection protective film (upper layer) 18 used herein have an etching rate that is slower than the third insulation film 8 under the etching conditions in forming the second aperture 11. For example, if the etching gas $CHF_3/O_2$ mixture ratio is changed to 1:1, the etching rate of the silicon oxide film and the BCB film become to be 130 nm/minute and 750 nm/minute, respectively. (FIG. 10(b)).

After the above, using the second aperture 11, the upper layer 18 and lower layer 17 of the first interconnection protective film are etched, thereby completing the second aperture 11 (FIG. 9(c)). To prevent oxidation of the interconnection layer surface during etching, it is desirable that the etching gas does not contain oxygen, even if the etching speed is reduced. If $CHF_3$ only is used, the etching rates of the silicon oxide film and the BCB film are 500 nm/minute and 100 nm/minute, respectively, this representing a large difference.

After the above, a conductive film is deposited on the interconnection layer 6 and the third insulation film 8, so as to fill the second and the third apertures 11 and 14. Then, CMP or the like is used to polish away the conductive film so that it remains only in the second and third apertures 11 and 14, thereby forming the second interconnection layer 15. Copper is used as the conductive film, and titanium nitride is formed as a liner film before forming the copper film. In the second interconnection layer as well, the film growing conditions for the copper and titanium nitride films are the same as for the first interconnection layer. The removal of the copper and titanium nitride films is also the same as the first interconnection layer, this being done using a CMP process.

After forming the second interconnection layer 15, a second interconnection protective film (lower layer) 19 and a second interconnection protective film (upper layer) 20 are formed on the combined surface of the first insulation film 8 and the second interconnection layer 15 (FIG. 10(d)). A benzocyclobutene (BCB) film with a dielectric constant of 2.7 and a thickness of 100 nm formed by an MVP process was used for the second interconnection protective film (lower layer) 19, and a silicon oxide film (200 nm) was used for the second interconnection protective film (upper layer) 20. Because the second interconnection protective film (lower layer) 19 has a dielectric constant lower than the second interconnection protective film (upper layer) 20 and is grown in a vacuum chamber, the second interconnection layer 15 is not caused to oxidize when the interconnection protective film is grown. Furthermore, by using a film having a dielectric constant that is low compared with the insulation film, it is possible to effectively reduce the capacitance between interconnections.

Example 5

The fifth embodiment of the present invention is described below, with references made to FIG. 11 and FIG. 12. In this embodiment as well, similar to the case of the first embodiment, an organic insulation film grown in a vacuum chamber is used as an interconnection protective film on a copper interconnection layer. While it is at present a yet undisclosed technology, the inventors proposed, in Japanese Patent Application H10-266851, the vaporization of an organic monomer as a method of forming a functional organic polymer film. In this method, an organic monomer is directly vaporized and the monomer within the vapor phase is polymerized onto a substrate, so as to obtain the organic polymer film. The case of using a DVS-BCB (divinyl siloxane benzocyclobutene) film as an organic film that can be grown in a vacuum chamber is described below.

The etching stop film used herein can be an organic film grown using plasma generated from an organic siloxane, such as methyl siloxane, as the raw material.

Figure 11:
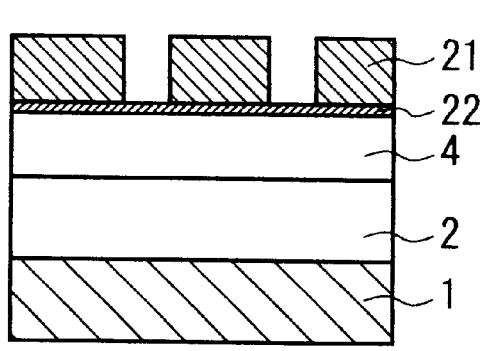
Figure 11:
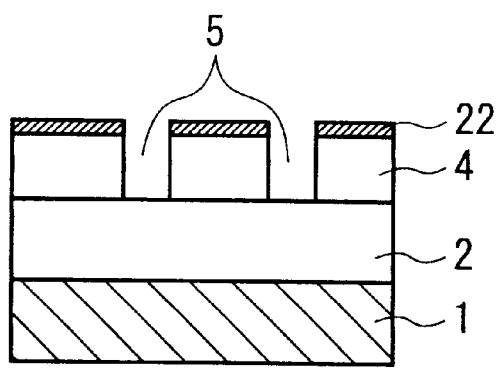
Figure 11:
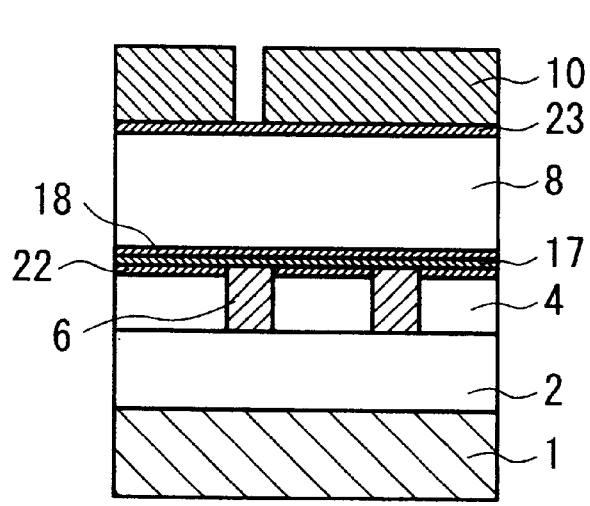
Figure 11:
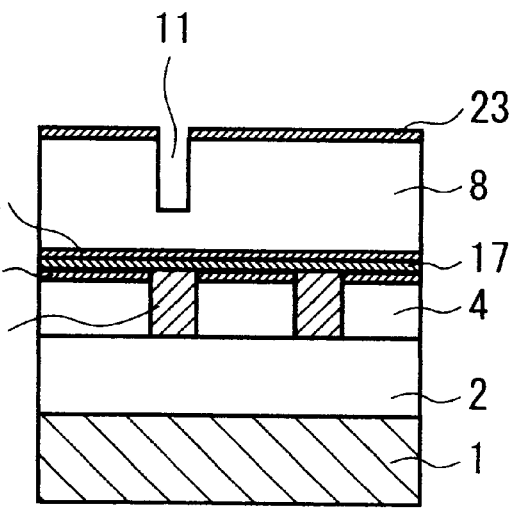
Figure 12:
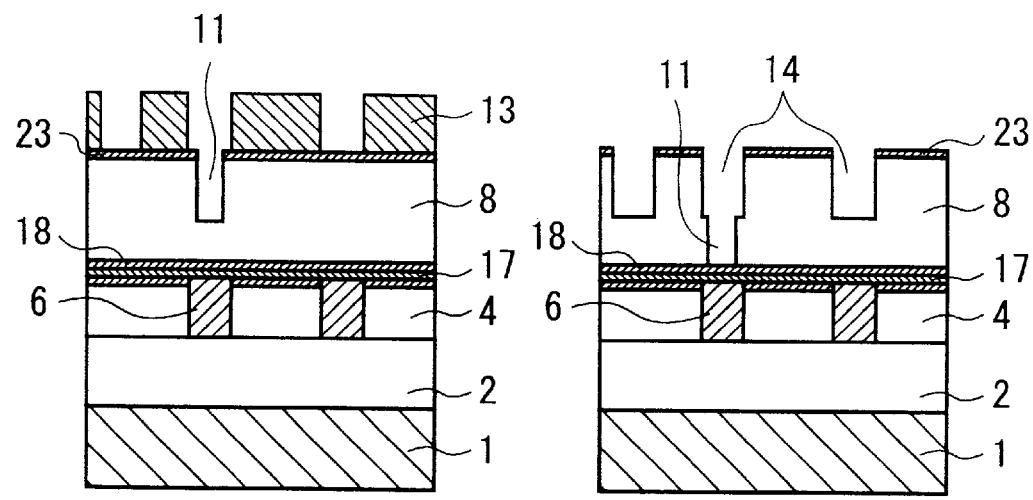
Figure 12:
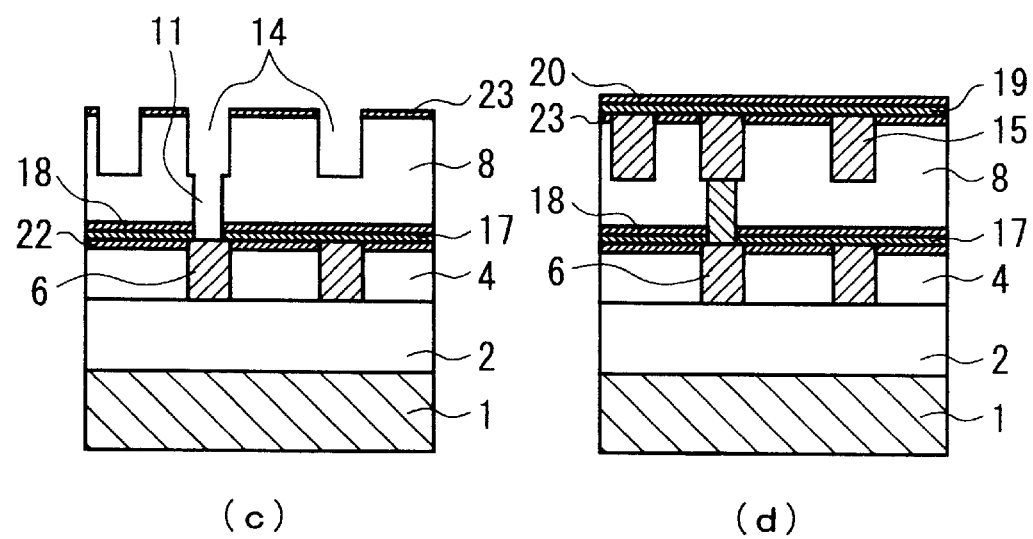

FIG. 11 and FIG. 12 are cross-section views showing the process steps for a multilayer interconnection structure. For example, a first insulation film 2 is formed on a semiconductor substrate 1 onto which is formed a transistor (not shown in FIG. 11 and FIG. 12), and a contact plug (not shown in FIG. 11 and FIG. 12) extending to the transistor diffusion layer is formed, after which a second insulation film 4 is further formed. A silicon oxide film of thickness 600 nm is used as the first insulation film 1, and a DVS-BCB (divinyl siloxane benzocyclobutene) film (300 nm) is used as the second insulation film 4. Additionally, a first etching mask layer 22 and first resist layer 21 are formed on the second insulation film 4, after which a first interconnection layer pattern thereon is formed (FIG. 11(a)). Using this pattern as a mask, the second insulation film 4 is etched, thereby forming the first aperture 5. A $CHF_3/O_2$ gas mixture was used as the etching gas. If the proportion of oxygen becomes larger than $CHF_3/O_2=80:20$, the etching rate of the silicon oxide film will be slower than that of the BCB film, and at $CHF_3/O_2=50:50$, the etching rates are 140 nm/minute for a silicon oxide film and 750 nm/minute for a BCB film, thereby making the etching ratio greater than 5. Under these conditions, as etching progresses, a first aperture 5 having the first insulation film 2 as its base is obtained (FIG. 11(b)). Because the first resist layer 21 is simultaneously etched back, so that the trench forming etching and resist layer peeling are performed simultaneously, the number of process steps for fabricating a multilayer interconnection structure is reduced.

A conductive film is deposited on the first and second insulation films, so as to fill the first aperture 5. Then, a CMP process or the like is used to polish away the conductive film, so that it remains only in the first aperture 5, thereby forming the first interconnection layer 6. Copper is used as the conductive film, and a titanium nitride film is formed as a liner film before formation of the copper film. The titanium nitride film is formed by an MOCVD process to a thickness of 10 nm, with a substrate temperate in the range from 250° C. to 350° C., and the copper film is grown to a thickness of 0.5 $\mu$m using an MOCVD process with the substrate temperature in the range 140° C. to 240° C. The copper and titanium nitride film in parts other than the aperture is removed using a CMP process with an alumina-based slurry. When this is done, the rotational speeds of the polishing pad and the substrate were 500 rpm and 60 rpm, respectively. The polishing pressure is 0.24 $kg/cm^2$.

After forming the first interconnection layer 6, a first interconnection protective film (lower layer) 17 and a first interconnection protective film (upper layer) 18 are formed on the combined surface of the second insulation film 4 and the first interconnection layer 6, and a third insulation film 8 is further formed. The upper layer and lower layer of the interconnection protective film are 200 nm and 100 nm thick, respectively, and the third insulation film 8 is 700 nm thick. The first interconnection protective film (lower layer) 17 uses a film that has a dielectric constant that is lower than the first interconnection protective film (upper layer) 18. A silicon oxide film with a dielectric constant of 4 is used as the first interconnection protective film (upper layer) 18, and a benzocyclobutene (BCB) film (dielectric constant 2.7) grown by the above-noted MVP process is used as the third insulation film 8 and the first interconnection protective film (lower layer) 17.

Additionally, a benzocyclobutene (BCB) film grown by the above-noted MVP process in a vacuum chamber is used for the first interconnection protective film (lower layer) 17, the result being that there is no oxidation of the copper of the first interconnection layer 6 when the first interconnection protective film (lower layer) 17 is formed. Furthermore, by using a film having a dielectric constant that is lower than that of the first interconnection protective film (upper layer) 18, it is possible to reduce the capacitance between interconnections.

After the third insulation film 8 is formed, a second etching mask 23 and a second resist layer 10 (400 nm) are formed, and an etching pattern for the second aperture 11 is formed (FIG. 11(c)). Using this pattern as a mask, the second etching mask is etched, thereby forming the etching pattern for the second aperture 11. In this etching step, similar to when the first aperture 5 is formed, a $CHF_3/O_2$ gas mixture is used as the etching gas. When the For a $CHF_3/O_2$ mixture ratio of 90:10, the etching ratio between the resist 10 and the BCB 8 is substantially 1, so that as etching progresses the resist layer 10 is etched back, and in an area in which there is no resist, the BCB film that forms the third insulation film is etched at an equal rate, thereby forming the aperture 11. By controlling the thickness of the resist layer 10 and the etching time, an aperture 11 having the third insulation film 8 as its bottom part is obtained (FIG. 11(d)).

A third resist layer 13 (400 nm) is formed on the third insulation film 8 in which is formed the second aperture 11 (FIG. 12(a)). Using the third resist layer 13 as a mask, the third insulation film 8 is again etched thereby forming the third aperture 14. The etching gas used for this, similar to the case of forming the first aperture 5, was a $CHF_3/O_2$ gas mixture. Because at a proportion of oxygen larger than $CHF_3/O_2=80:20$, the etching rate of the silicon oxide film will be slower than that of the BCB film, as the etching progresses, the second aperture 11 is formed with the first interconnection protective film (upper layer) 18 (a silicon oxide film in this case) as its bottom part. The resist layer 13 is simultaneously etched back, so that the trench forming and resist peeling are performed simultaneously.

After the above, using the second aperture 1, both the upper layer 18 and the lower layer 17 of the first interconnection protective film are etched, thereby forming the second aperture 11 (FIG. 12 (c)). To prevent oxidation of the interconnection layer surface during etching, it is desirable that the etching gas does not contain oxygen, even if the etching speed is reduced. In this case, $CHF_3$ was used as the etching gas. If $CHF_3$ only is used, the etching rates of the silicon oxide film and the BCB film are 500 nm/minute and 100 nm/minute, respectively, this representing a large difference, so that even if there is a discrepancy between etching pattern and the second aperture pattern, the side wall of the BCB film 8 of the third interconnection layer is not excessively overetched.

After the above, a conductive film is deposited on the first interconnection layer 6 and the third insulation film 8, so as to fill the second and third apertures 11 and 14. Then, the conductive film is polished away using a CMP process or the like, so that it remains only in the second and third apertures 11 and 14. Copper is used as the conductive film, and a titanium nitride film is formed as a liner film before the formation of the copper film. In the second interconnection layer as well, the film growing conditions for the copper and titanium nitride films are the same as for the first interconnection layer. The removal of the copper and titanium nitride film, similar to the case of the first interconnection layer, was done using a CMP process.

After forming the second the interconnection layer 15, a second interconnection protective film (lower layer) 19 and a second interconnection protective film (upper layer) 20 are formed on the combined surface of the third insulation film 8 and the second interconnection layer 15 (FIG. 12(d)). A benzocyclobutene (BCB) film having a dielectric constant of 2.7 and the thickness of 100 nm formed by the above-noted MVP process is used as the second interconnection protective film (lower layer) 19 and a silicon oxide film (200 nm) is used as the second interconnection protective film (upper layer) 20. Because the second interconnection protective film (lower layer) 19 has a dielectric constant lower than that of the second interconnection protective film (upper layer) 20, and is formed in a vacuum chamber, there is no oxidation of the copper of the second interconnection layer 15 when the interconnection protective film 19 is formed. Furthermore, by using a film having a low dielectric constant compared with the insulation film, it is possible to effectively reduce the capacitance between interconnections.

In place of DVS-BCB, it is possible to use other substances as the organic vapor-phase growth material, including parylene N, parylene F, parylene C, parylene AF4, Teflon, Teflon AF, amorphous fluorocarbon, hexamethyl disiloxane, polyimide, naphthalene fluoride, naphthalene, benzocyclobutene fluoride, phenyl methoxy silane, maleimide benzocyclobutene, or parfluorocyclobutene aromatic ester.

By adopting the above-described constitution, it is possible to reduce the capacitance between interconnections.

What is claimed is:

1. A semiconductor device comprising:

a first insulation film;

a second insulation film formed over said first insulation film;

an inlayed interconnection layer formed in said second insulation film;

an organic film provided on said inlayed interconnection layer and said second insulation film, said organic film having a dielectric constant lower than said second insulation film; and an etching stop film provided over said organic film.

2. A semiconductor device according to claim 1, wherein said second insulation film is an organic film having a dielectric constant lower than said first insulation film.

* * * * *